United States Patent
Hyodo et al.

(10) Patent No.: US 10,467,363 B2
(45) Date of Patent: Nov. 5, 2019

(54) FAULT SIMULATION SYSTEM

(71) Applicant: Hitachi Automotive Systems, Ltd., Ibaraki (JP)

(72) Inventors: Akihiko Hyodo, Tokyo (JP); Yasuo Sugure, Tokyo (JP); Shogo Nakao, Tokyo (JP); Yoshinobu Fukano, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 181 days.

(21) Appl. No.: 15/522,268

(22) PCT Filed: Oct. 5, 2015

(86) PCT No.: PCT/JP2015/078176
§ 371 (c)(1),
(2) Date: Apr. 26, 2017

(87) PCT Pub. No.: WO2016/080092
PCT Pub. Date: May 26, 2016

(65) Prior Publication Data
US 2017/0316134 A1 Nov. 2, 2017

(30) Foreign Application Priority Data
Nov. 19, 2014 (JP) ................................ 2014-234116

(51) Int. Cl.
*G06F 17/50* (2006.01)
*G01M 17/007* (2006.01)
*G01R 31/00* (2006.01)

(52) U.S. Cl.
CPC ....... *G06F 17/5022* (2013.01); *G01M 17/007* (2013.01); *G01R 31/007* (2013.01)

(58) Field of Classification Search
CPC .......................... G06F 11/261; G01M 17/007
See application file for complete search history.

(56) References Cited

U.S. PATENT DOCUMENTS 6,013,994 A * 1/2000 Endo .................... B62D 5/0463
318/430
2006/0041417 A1 2/2006 Palladino
(Continued)

FOREIGN PATENT DOCUMENTS

| JP | 2012-220378 A | 11/2012 |
| JP | 5295355 B2 | 9/2013 |
| JP | 2013-252732 A | 12/2013 |

OTHER PUBLICATIONS

Ghimire, Rajeev, et al. Integrated model-based and data-driven fault detection and diagnosis approach for an automotive electric power steering system. AUTOTESTCON, 2011 IEEE. IEEE, 2011. (Year: 2011).*

(Continued)

*Primary Examiner* — Omar F Fernandez Rivas
*Assistant Examiner* — David A Hopkins
(74) *Attorney, Agent, or Firm* — Procopio, Cory, Hargreaves & Savitch LLP

(57) ABSTRACT

A fault simulation system that has a simulation unit comprising an ECU model including an element fault model made to have a fault by a time setting or external command and all or a portion of a sensor model, actuator model, vehicle model, and driver model and can evaluate vehicle behavior at the time of an element fault according to driving operation based on a set travel scenario, wherein the passage time, vehicle behavior, driving operation, and the like, at each point on a course are determined through non-fault simulation and on the basis of that information, an element fault is inserted according to a fault time setting or fault command for the element fault model.

14 Claims, 10 Drawing Sheets

(56) References Cited

U.S. PATENT DOCUMENTS

2011/0078526 A1\* 3/2011 Mohr .................. G01R 31/007
 714/741
2012/0029893 A1 2/2012 Komatsu et al.

OTHER PUBLICATIONS

Wang, Rongrong, and Junmin Wang. Fault-Tolerant Control of Electric Ground Vehicles with Independently-Actuated Wheels. ASME 2010 Dynamic Systems and Control Conference. American Society of Mechanical Engineers, 2010. (Year: 2010).\*

Reorda, Matteo Sonza, and Massimo Violante. Hardware-in-the-loop-based dependability analysis of automotive systems. On-Line Testing Symposium, 2006. IOLTS 2006. 12th IEEE International. IEEE, 2006. (Year: 2006).\*

Grillinger, Petr, and Pavel Herout. "Simulation tool for functional verification of ttp/c-based systems." Simulation in Industry: 15th European Simulation Symposium. Erlangen: SCS. 2003. (Year: 2003).\*

Juez, Garazi, et al. "Safety assessment of automated vehicle functions by simulation-based fault injection." 2017 IEEE International Conference on Vehicular Electronics and Safety (ICVES). IEEE, 2017. (Year: 2017).\*

Silveira, Alexandre M., Rui E. Araújo, and Ricardo de Castro. "FIEEV: a co-simulation framework for fault injection in electrical vehicles." 2012 IEEE International Conference on Vehicular Electronics and Safety (ICVES 2012). IEEE, 2012. (Year: 2012).\*

Nilsson, Josef, et al. "Driver performance in the presence of adaptive cruise control related failures: Implications for safety analysis and fault tolerance." 2013 43rd Annual IEEE/IFIP Conference on Dependable Systems and Networks Workshop (DSN-W). IEEE, 2013. (Year: 2013).\*

Duelks, Ramona, Falk Salewski, and Stefan Kowalewski. "A real-time test and simulation environment based on standard FPGA hardware." 2009 Testing: Academic and Industrial Conference—Practice and Research Techniques. IEEE, 2009. (Year: 2009).\*

Jha, Saurabh, et al. "Kayotee: A fault injection-based system to assess the safety and reliability of autonomous vehicles to faults and errors." arXiv preprint arXiv:1907.01024 (2019). (Year: 2019).\*

Short, Michael, and Michael J. Pont. "Assessment of high-integrity embedded automotive control systems using hardware in the loop simulation." Journal of Systems and Software 81.7 (2008): 1163-1183. (Year: 2008).\*

International Search Report and Written Opinion for PCT App No. PCT/JP2015/078176 dated Dec. 15, 2015, 8 pgs.

\* cited by examiner

FIG. 9

TRAVEL SCENARIO                                                                114

| 901 | 902 | 903 | 904 | 905 | 906 | |
|---|---|---|---|---|---|---|
| SENARIO ID | COURSE TYPE | ROAD MU | SPEED | DRIVER TYPE | VEHICLE TYPE | ... |
| 1 | Straight | Low-$\mu$ | 100kph | Expert | C-class | ... |
| 2 | R80 | High-$\mu$ | 60kph | Novice | D-class | ... |
| ... | ... | ... | ... | ... | ... | ... |

FIG. 10

TRAVEL INFORMATION                                                             501

| 501 | 501 | 501 | 501 | 501 | |
|---|---|---|---|---|---|
| RUN ID | TRAJECTORY | STEERING ANGLE | BRAKE PRESSURE | YAW RATE | ... |
| 1 | [x1(t),y1(t)] | $\delta 1(t)$ | [fl1(t),fr1(t), rl1(t),rr1(t)] | y1(t) | ... |
| 2 | [x2(t),y2(t)] | $\delta 2(t)$ | [fl2(t),fr2(t), rl2(t),rr2(t)] | y2(t) | ... |
| ... | ... | ... | ... | ... | ... |

FIG. 11

DATA DEFINITION OF FAULT INSERTION ELEMENT MODEL

| PARAMETER NAME | DATA TYPE | VALUE | ... |
|---|---|---|---|
| S_IN | Bool | \<Variable\> | ... |
| Ron | Real | \<Constant1\> | ... |
| Roff | Real | \<Constant2\> | ... |
| ... | ... | ... | ... | ent and an example of model description using the VHDL-AMS language.
FAULT SIMULATION SYSTEM

CROSS-REFERENCE TO RELATED APPLICATIONS

This application is a U.S. National Stage entry of PCT Application No. PCT/JP2015/078176, filed on Oct. 5, 2015, which claims priority from JP App No: 2014-234116 filed Nov. 19, 2014, the contents of which are incorporated by reference.

TECHNICAL FIELD

The present invention relates to a simulation system that inserts electrical faults, such as open circuits, short circuits, and drifts, into electronic components configuring an on-vehicle electronic control unit (in the following, referred to as ECU) and evaluates the influence of the faults on a vehicle plant, which is a control target.

BACKGROUND ART

In the automobile industry, the application of the functional safety standards ISO 26262 and the compliance with the standards are being required in the development of electrical/electronic components and software of a microcomputer installed on the components. Automobile manufacturers and suppliers are constructing development environments that satisfy the requirements. In ISO 26262 Part 4 8.4.2 (hardware-software integration and testing), in principle, verification is required for all faults of all elements packaged on a printed wiring board by a real vehicle or by simulation. In fault insertion testing by real vehicles, it is difficult to cope with modes, such as a mode in which an ECU is broken one time and a mode in which the accumulation of electrical damage cases no reproducibility. Experiments are conducted on over 10,000 experimental items. Thus, real vehicle testing exerts a serious influence on man-hours, time periods, and costs. In such situations, methods of fault insertion testing using simulation-based virtual ECUs are being investigated.

Patent Literature 1 discloses a method (Method for Fault Analysis Using Simulation) in which faults in the open circuit and short circuit of electronic components are analyzed by simulation. According to the simulation method of Patent Literature 1, a model of a faulty ECU circuit is created by connecting variable resistors in series or in parallel. A circuit topology is changed for each fault for simulating the faulty ECU circuit.

CITATION LIST

Patent Literature

Patent Literature 1: US Patent Application Publication No. 2006/0041417

SUMMARY OF INVENTION

Technical Problem

Here, in the functional safety standards stated earlier, hazard analysis and risk assessment (in the following, referred to as H & R) are required in the concept phase. In hazard analysis, for example, there are methods, such as a method in which fault modes of components are first considered by bottom-up methods, how the fault modes affect the overall system is examined to find hazards. The extent of damage, the probability of exposure (occurrence), and controllability, which are caused by the extracted hazards, are then evaluated on the extracted hazards in assumed representative situations to determine the severity of a risk.

In the fault simulation method described in Patent Literature 1, the occurrence of faults based on situations required in H & R and the influence on vehicle behaviors are not readily evaluated.

Solution to Problem

The present invention is embodied by a simulation system including: a simulation unit that executes a plurality of simulations including a simulation of an electronic control unit (ECU) process and a simulation of a vehicle process and generates travel information; an analysis unit that sets a type of fault to the travel information received from the simulation unit; a control unit that causes the simulation unit to perform a simulation when a fault is caused based on the travel information to which the occurrence of the fault is set; and an output unit that outputs an executed result of the simulation unit.

Advantageous Effects of Invention

According to the present invention, the occurrence of faults based on conditions set by a user and the influence on vehicle behaviors can be readily evaluated.

BRIEF DESCRIPTION OF DRAWINGS

FIG. 9 is an example of a travel scenario table according to an embodiment.

FIG. 10 is an exemplary travel information table according to an embodiment.

FIG. 11 is an exemplary data definition table of fault insertion element models according to an embodiment.

DESCRIPTION OF EMBODIMENTS

In the following, embodiments will be described with reference to the drawings.

First Embodiment

Figure 1:
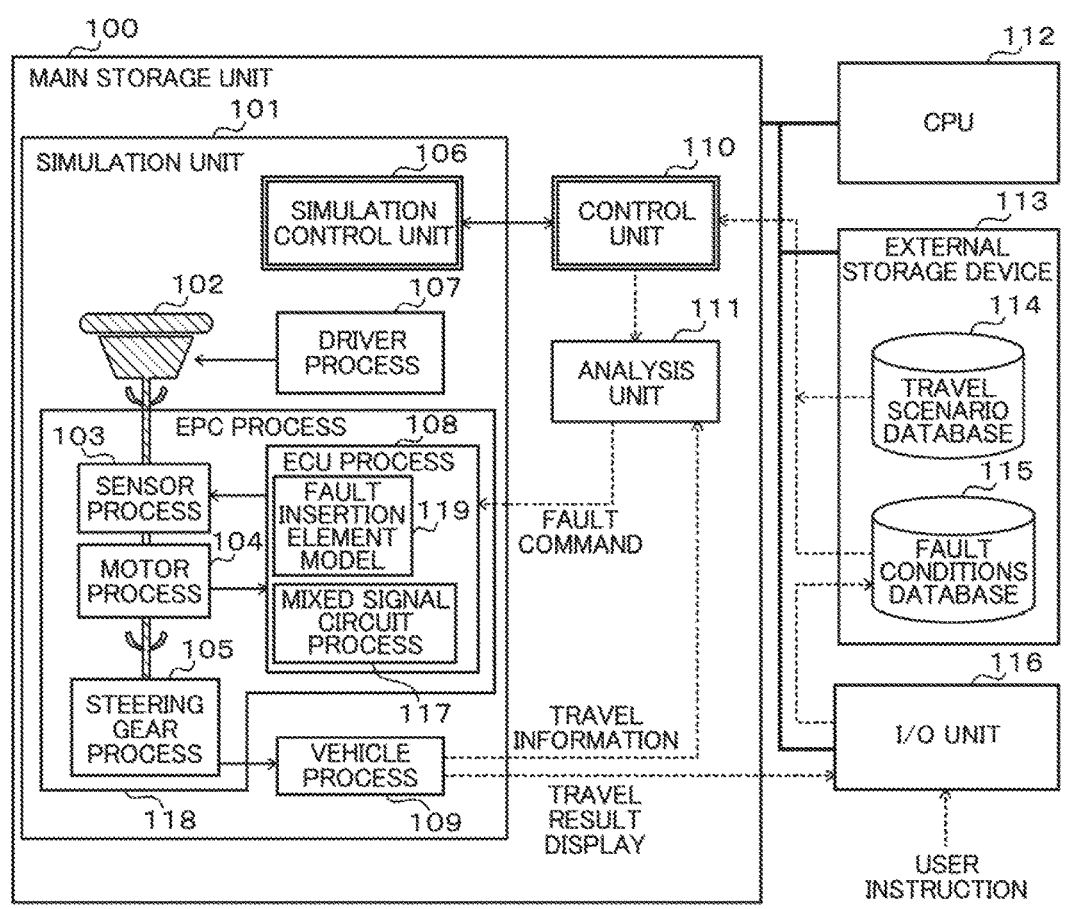
FIG. 1 is a block diagram of an exemplary fault simulation system according to an embodiment.

FIG. 1 is a block diagram of an exemplary fault simulation system for implementing the present invention. The fault simulation system at least includes an I/O unit 116 that inputs simulation conditions and outputs simulation results to a screen, an external storage device 113 that stores a travel scenario 114 and a fault condition 115 inputted through the I/O unit 116, a main storage unit 100 that stores a simulation unit 101 including all execution processes of simulation and an analysis unit 111 analyzing simulation results, and a CPU 112 that performs arithmetic operations necessary for simulation.

Here, the simulation unit 101 can find traveling states based on travel scenarios and travel results by: a driver process 107 that performs driving operation based on the travel scenario 114 through a steering wheel 102; a torque sensor process 103 that detects steering torque applied to the steering wheel 102 by electrical signals; a microcomputer process, not shown, performing a program that calculates an assist torque amount based on the steering torque and calculates a required torque amount for the motor process 104; an ECU process 108 including processes, such as a mixed signal circuit process, the mixed signal circuit, not shown, having an analog element and a digital element combined, including a driver circuit that drives the motor process 104 based on the output signal in the microcomputer process, a monitor circuit that detects drive electric currents in the motor process 104, a power supply circuit that supplies electric power, and other circuits; and a vehicle process 109 that can perform a simulation of an electric power assisted steering (EPS) system having all or some of steering gear processes that convert the torque output of the motor process 104 into rack thrust and calculates vehicle behaviors from the output of the EPS process. A flow of a series of these processes is controlled by a simulation control unit 106. In the analysis unit 111, based on the fault condition 115 inputted by a user, timing at which a fault is caused is determined based on traveling states outputted from the simulation unit, and then a fault command is transmitted to the ECU process 108. A flow of all the processes of the fault simulation is controlled by the control unit 110.

Figure 2:
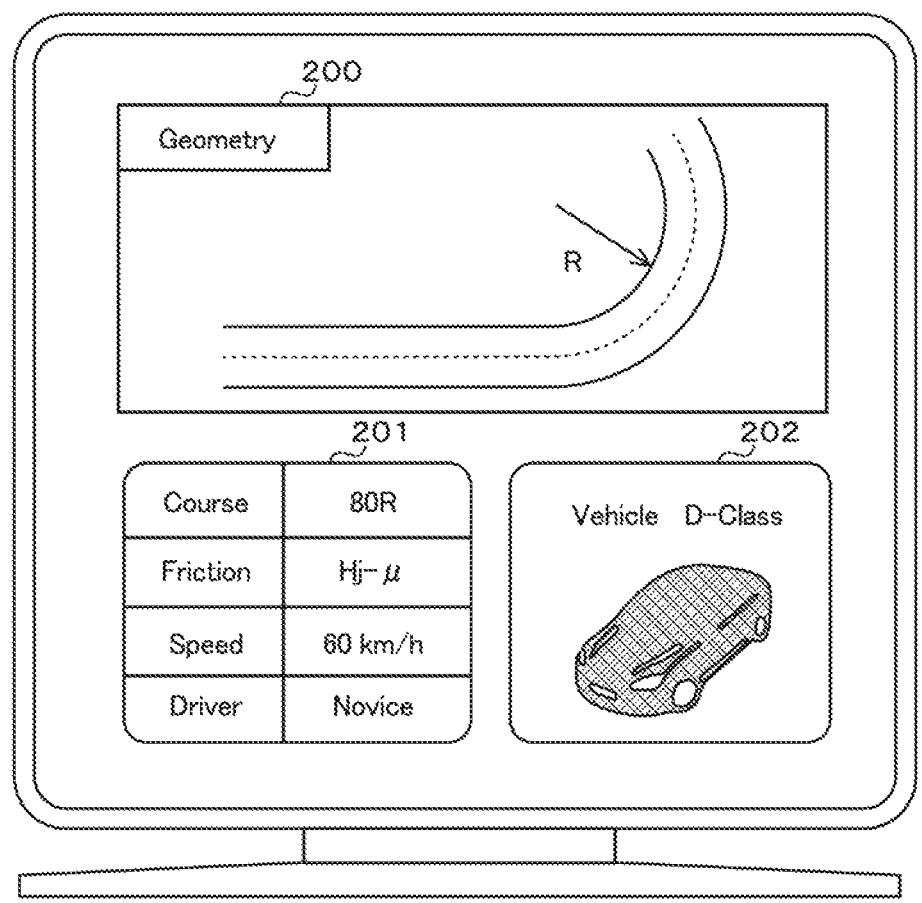
FIG. 2 is an exemplary screen for inputting a travel scenario according to an embodiment.

FIG. 2 is an exemplary screen for inputting a travel scenario according to the embodiment.

The user inputs information necessary for simulation, such as a driving course, a road surface friction factor, the profile of targeted driving speed, and specifying a type of driver model or a steering pattern of a driver (201). Alternatively, the selection and display of a vehicle type (202) and a course geometry (200) may be included. As described above, the user can set a desired travel scenario through an input screen.

Figure 3:
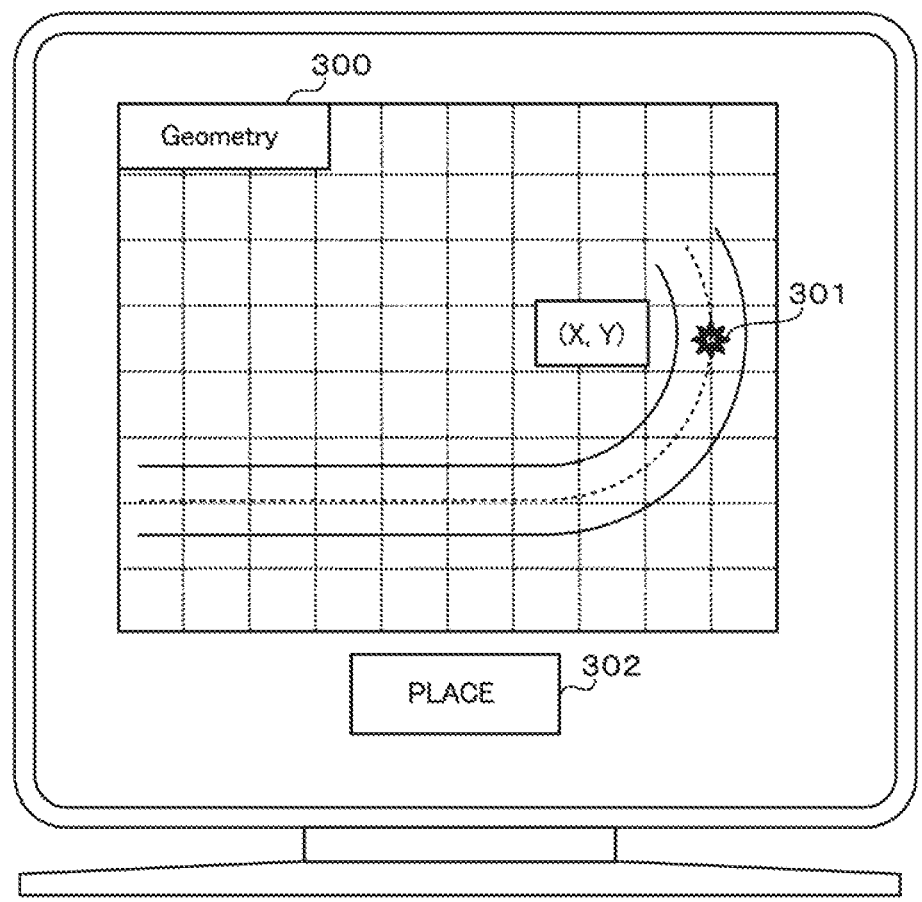
FIG. 3 is an exemplary screen for inputting fault conditions according to an embodiment.

Next, FIG. 3 is an exemplary screen for inputting fault conditions according to the embodiment.

There is a method in which coordinates are specified on a driving course geometry 300 selected by a user by a process of placing a fault marker 301 at a desired position on a course center line (by pressing a button 302) for specifying a site where a fault occurs.

However, other methods of setting conditions for causing faults can be considered. For example, there is a method of setting fault conditions in which the coordinates of two points are specified on the driving course to draw a line and when a vehicle passes the line, this is the occurrence of a fault. For example, there is a method of setting fault conditions in which a distance covered by a vehicle is inputted and a time instant at which the vehicle covers the distance is a fault condition.

In the case of using an element fault model that can return to a normal state at a set time instant, a transient fault can also be simulated by a method in which the passage time of a vehicle on a certain segment on the set course is a fault period, and a method in which the time instant of ending a fault is set based on elapsed time from the time instant of fault insertion. In addition to manipulating a vehicle of interest or the driver of a vehicle of interest, conditions may be set, such as a relative position and a relative speed, based on the relationship with another vehicle or another object.

Figure 4A:
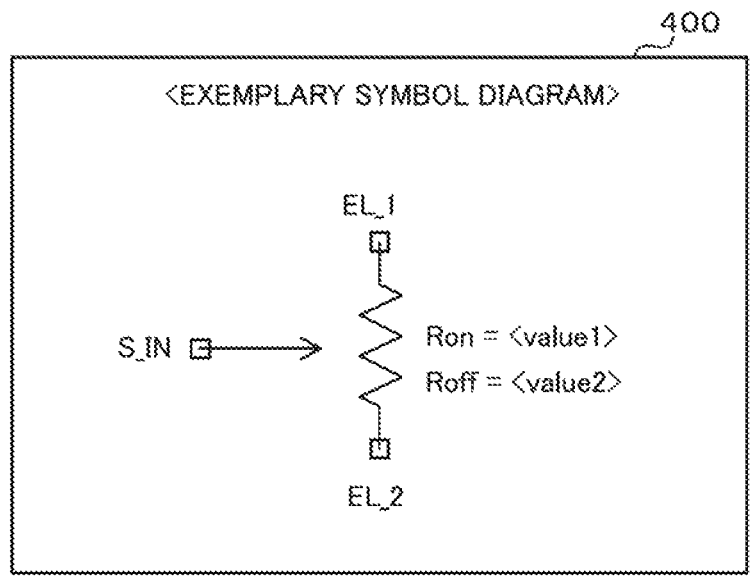
FIGS. 4A and 4B are examples of a symbol diagram of elements used for fault insertion according to an embodiment and an example of model description using the VHDL-AMS language.
Figure 4B:
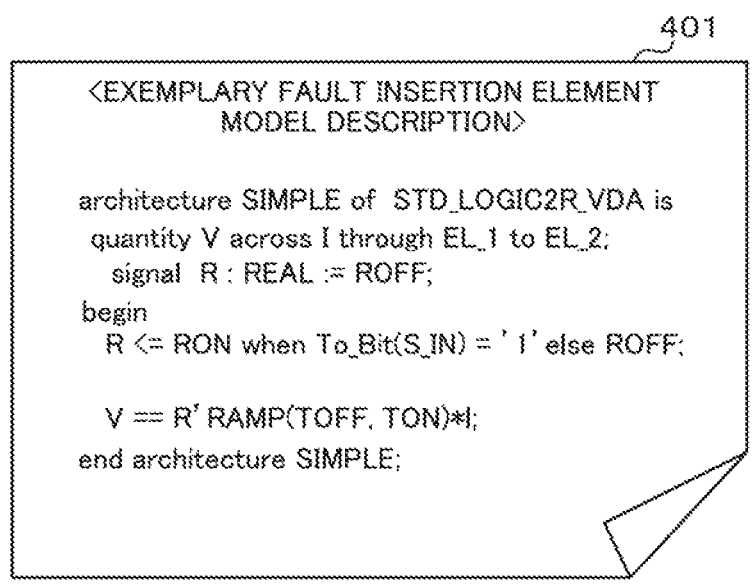

FIG. 4A is a symbol diagram 400 of elements used for fault insertion according to the embodiment. FIG. 4B is an example of a model description 401 using the VHDL-AMS language.

The elements used for fault insertion shown in FIG. 4A and FIG. 4B are described so that a resistance value can be switched between a variable Ron and a variable Roff by an external control input (S_IN).

Figure 5:
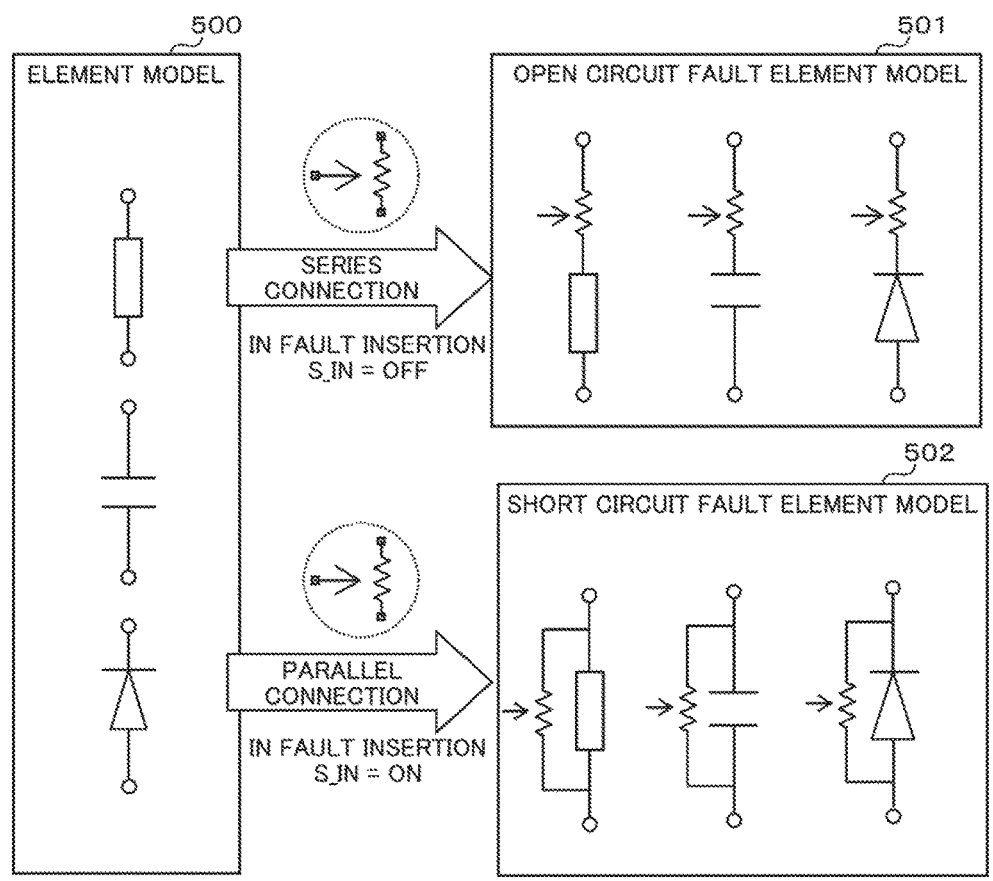
FIG. 5 is an example of generating fault elements for simulating an open circuit and a short circuit according to an embodiment.

FIG. 5 is examples of generating fault element models for simulating an open circuit fault and a short circuit fault according to the embodiment.

The element model 401 shown in FIG. 4B is connected to a typical circuit element 500 in series, and hence an open circuit fault element model 501 can be generated. Moreover, the element model 401 is connected to the circuit element 500 in parallel, and hence a short circuit fault element model 502 can be generated. However, at this time, it is necessary to set the variable Ron to a minute value around 0Ω and the variable Roff to a large value, a few MΩ.

Figure 6:
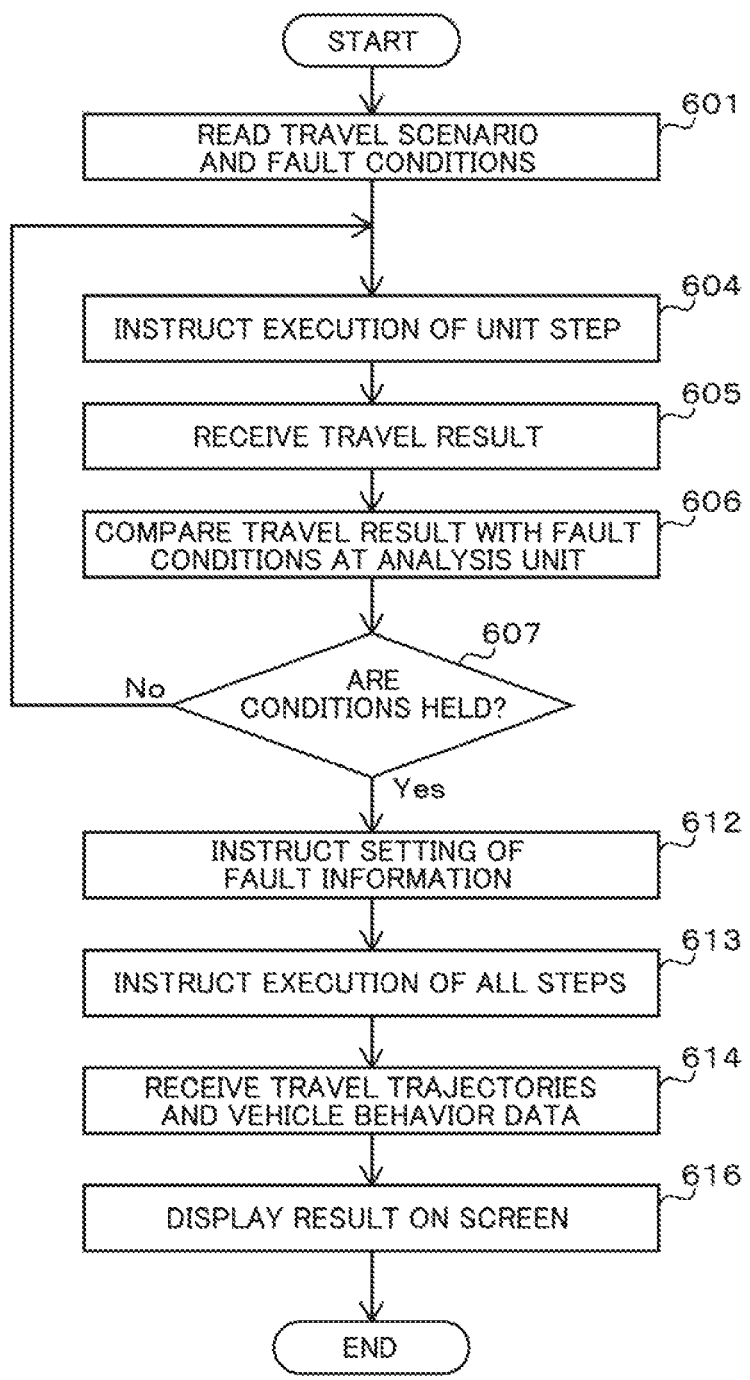
FIG. 6 is a flowchart of an exemplary fault simulation method according to an embodiment.

FIG. 6 is a flowchart of an exemplary fault simulation method according to the embodiment.

When the execution of the control unit 110 is started (600), first, a travel scenario set by a user is read (601), and fault conditions corresponding to the travel scenario are also read (602). A simulation is then started (603). The control unit 110 transmits a command to the simulation control unit 106 to execute a unit step (604).

The simulation control unit 106 having received the command simulates the unit step at the simulation unit 101, and returns the result to the control unit 101. After receiving the travel result, the control unit 110 causes the analysis unit 111 to compare the travel result with the fault conditions to determine whether to hold the conditions (607).

In the case where the conditions are not held, the simulation control unit 106 starts the execution of the subsequent unit step (604). In the case where the conditions are held, the control unit 110 begins a fault insertion process. First, the control unit 110 transmits a command to the simulation control unit 106 to set a desired fault on a target element. The simulation control unit 106 sets fault information (620), and then transmits a notification of completion (621).

After receiving the notification of completion, the control unit 110 instructs the simulation control unit to execute a simulation until finish time (622). After receiving all data of travel trajectories and vehicle behaviors (614), the control unit 110 ends the simulation (615). The control unit 110 outputs the result to the screen (616), and then a series of the processes is ended (617).

Figure 7:
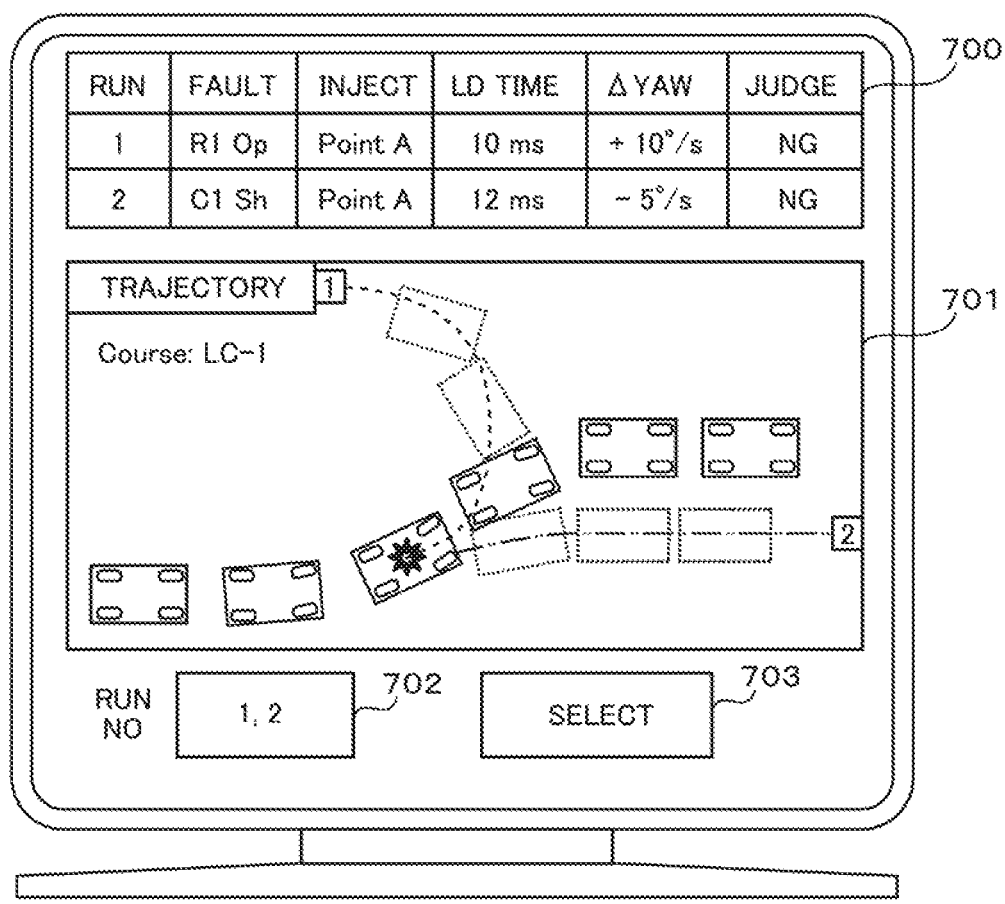
FIG. 7 is an example of an output of a travel result displayed on a screen according to an embodiment.

FIG. 7 is an example of an output of a travel result displayed on a screen according to the embodiment.

A travel number, which is desired to be displayed, is specified (702), a button 703 is then pressed, and hence various items of result data 700 and a travel trajectory 701 are displayed. When the travel trajectories are overlapped with each other for display, this provides differences to be easily observed. Thus, the travel trajectories may be overlapped with each other. For example, the result data 700 shows a fault type (FAULT), the setting content of fault conditions (INJECT), time to a lane drift (LD TIME), a yaw rate value increased or decreased by the occurrence of a fault (AYAW), and other parameters. The criteria for determining whether to be hazardous or not are set in advance, and this allows the judgment (JUDGE) whether to pass or fail as well.

Second Embodiment

In the first embodiment, in the flowchart of the control unit, the control unit transmits commands to the simulation control unit so that the fault conditions are determined in each step of executing a simulation, and after the conditions are held, a fault is caused in the subsequent execution step. The embodiment will describe that it is possible to use an element model that causes a fault at preset time instant, not triggered by an external control input (in the following, referred to as a time triggered element fault model).

In this case, a simulation in normal operation is executed until finish time. At which time instant the conditions are held is analyzed under a plurality of fault conditions. The time instant is set to the time triggered element fault model. Thus, a fault simulation can be again executed.

Figure 8:
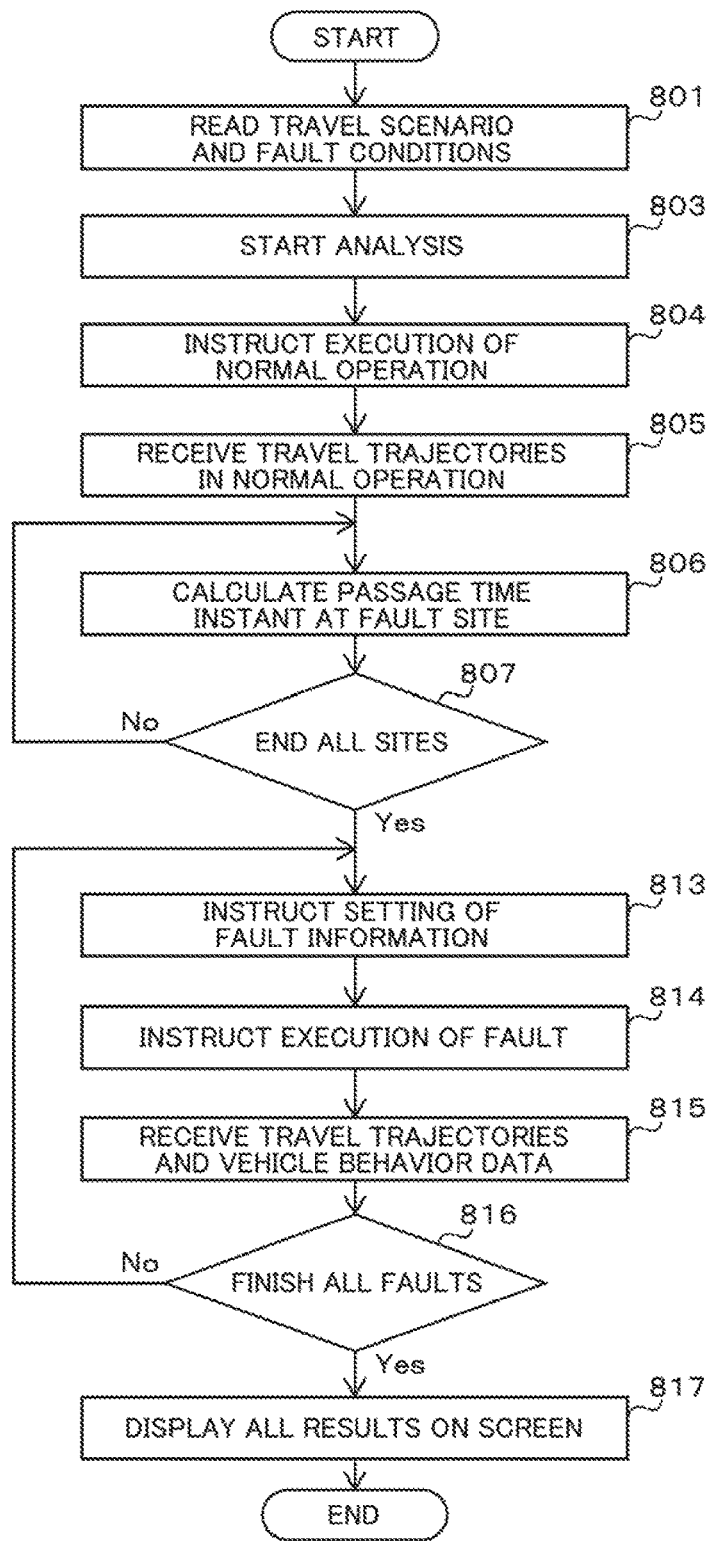
FIG. 8 is a flowchart of an exemplary fault simulation method according to an embodiment.

FIG. 8 is an exemplary flowchart of the control unit according to the embodiment. Referring to FIG. 6, only steps in which processes are changed from ones in the first embodiment are described below.

In Step 804, with no sequential execution control over unit steps, the control unit instructs the simulation control unit to execute a simulation until finish time.

In Step 807, since a plurality of fault conditions is set, a time instant at which conditions are held is calculated for all the conditions.

In Step 816, fault insertion simulation is executed on all the fault conditions.

Note that, the first embodiment or the second embodiment describes the methods and the systems, which are all off-line simulation-based methods and systems. However, some or all the methods and the systems may be based on a real vehicle. With the combination of a real vehicle and simulation, the influence on vehicle behaviors when a fault occurs can be evaluated in situations much closer to the situations of an actual vehicle.

Suppose that the influences of target faults on the execution of software of a microcomputer installed on an ECU are in advance evaluated by simulation, for example, the occurrence of faults on the ECU can be simulated by a method in which an input signal to be a trigger to cause a fault on the ECU is connected, and the operation of software can be switched to the operation when a fault occurs based on a change in the signal. In this case, for example, as illustrated in the drawings, hardware or software is installed, which outputs a fault trigger signal based on the positional information from a global positioning system (GPS) and other devices and based on the detected values of driving operation and vehicle behaviors obtained from on-vehicle sensors. Thus, the present invention can also be implemented on a real vehicle and in a real-time simulation environment.

REFERENCE SIGNS LIST

100 . . . main storage unit
101 . . . simulation unit
102 . . . steering wheel
103 . . . sensor process
104 . . . motor process
105 . . . steering process
106 . . . simulation control unit
107 . . . driver process
108 . . . ECU process
109 . . . vehicle process
110 . . . control unit
111 . . . analysis unit
112 . . . CPU
113 . . . external storage device
114 . . . travel scenario DB
115 . . . fault condition DB
116 . . . I/O unit

The invention claimed is:

1. A simulation system comprising a CPU with a non-transitory main storage unit that stores operations for execution by the CPU, the instructions comprising:
a simulation unit that executes a plurality of simulations including a simulation of an electronic control unit (ECU) process and a simulation of a vehicle process, and generates travel information;
an analysis unit that sets a type of fault to the travel information received from the simulation unit;
a control unit that causes the simulation unit to execute the plurality of simulations a second time to simulate an occurrence of when the fault is set based on the travel information; and
an output unit that outputs an executed result of the simulation unit wherein the fault is an element fault including switchable resistance values of an electronic component configuring an ECU;
wherein for the element fault, a control input controls the switchable resistance values of a variable resistor element, the variable resistor element being in series connection to an element in a normal state for simulating an open circuit and in parallel connection to the element in the normal state for simulating a short circuit, wherein the simulating the open circuit or the short circuit is facilitated by the control input at a time instant of the element
wherein a time instant at which a trajectory of a vehicle at a representative point intersects with a fault insertion line defined by a line segment connecting two points on a plane of a course is the time instant of inserting the element fault, and the simulation of the ECU process and the simulation of the vehicle process are initiated at the time instant of the inserting the element fault.

2. The simulation system according to claim 1, wherein the travel information is information including a vehicle trajectory outputted from the simulation unit.

3. The simulation system according to claim 1 wherein the analysis unit sets, to travel information about a target vehicle for simulation, positional information to cause the fault on the vehicle.

4. The simulation system according to claim 3,
wherein the simulation unit is formed of:
a torque sensor process that accepts an input of steering torque from a driver process and detects the steering torque with an electrical signal;
a microcomputer process that executes a program determining an assist torque amount based on the steering torque and calculating a required torque amount for a motor;
a mixed signal circuit process, in which a mixed signal circuit has an analog element and a digital element combined, including a driver circuit that drives the motor based on an output signal in the microcomputer process, a monitor circuit that detects a drive electric current of the motor, and a power supply circuit that supplies electric power;

an electric power assisted steering (EPS) system process having at least one process of steering gear processes that convert a torque output of the motor into rack thrust; and a vehicle motion process that finds a vehicle behavior from an output in the EPS process based on the travel information.

5. The simulation system according to claim 1, wherein the element fault is a transient fault that is returned from a fault state by again inverting the control input at a set time instant of normal return.

6. The simulation system according to claim 5,
wherein a range of time instants in which a vehicle is driving in a specific region in a course included in the travel information is found;
based on the range of the found time instants, the time instant of inserting the element fault and the set time instant of normal return are determined; and
the simulation of the vehicle process is initiated at the time instant of inserting the element fault.

7. The simulation system according to claim 5, wherein the set time instant of normal return is set after a lapse of a certain time period from the time instant of inserting a fault.

8. A simulation system comprising a CPU with a non-transitory main storage unit that stores operations for execution by the CPU, the instructions comprising:
a simulation unit that executes a plurality of simulations including a simulation of an electronic control unit (ECU) process and a simulation of a vehicle process and generates travel information;
an analysis unit that sets a type of fault to the travel information received from the simulation unit;
a control unit that causes the simulation unit to execute the plurality of simulations a second time to simulate an occurrence of when the fault is set based on the travel information; and
and an output unit that outputs an executed result of the simulation unit;
wherein the fault is an element fault including switchable resistance values of an electronic component configuring an ECU;
wherein for the element fault, a control input controls the switchable resistance values of a variable resistor element, the variable resistor element being in series connection to an element in a normal state for simulating an open circuit and in parallel connection to the element in the normal state for simulating a short circuit, wherein the simulating the open circuit or the short circuit is facilitated by the control input at a time instant of the element fault;
wherein a time instant at which a distance covered by a vehicle is matched with a set value is the time instant of inserting the element fault, and the simulation of the ECU process and the simulation of the vehicle process are initiated at the time instant of the inserting the element fault.

9. The simulation system according to claim 8, wherein the travel information is information including a vehicle trajectory outputted from the simulation unit.

10. The simulation system according to claim 8 wherein the analysis unit sets, to travel information about a target vehicle for simulation, positional information to cause the fault on the vehicle.

11. The simulation system according to claim 10,
wherein the simulation unit is formed of:
a torque sensor process that accepts an input of steering torque from a driver process and detects the steering torque with an electrical signal;
a microcomputer process that executes a program determining an assist torque amount based on the steering torque and calculating a required torque amount for a motor;
a mixed signal circuit process, in which a mixed signal circuit has an analog element and a digital element combined, including a driver circuit that drives the motor based on an output signal in the microcomputer process, a monitor circuit that detects a drive electric current of the motor, and a power supply circuit that supplies electric power;
an electric power assisted steering (EPS) system process having at least one process of steering gear processes that convert a torque output of the motor into rack thrust; and
a vehicle motion process that finds a vehicle behavior from an output in the EPS process based on the travel information.

12. The simulation system according to claim 8, wherein the element fault is a transient fault that is returned from a fault state by again inverting the control input at a set time instant of normal return.

13. The simulation system according to claim 12,
wherein a range of time instants in which a vehicle is driving in a specific region in a course included in the travel information is found;
based on the range of the found time instants, the time instant of inserting the element fault and the set time instant of normal return are determined; and
the simulation of the vehicle process is initiated at the time instant of inserting the element fault.

14. The simulation system according to claim 13, wherein the set time instant of normal return is set after a lapse of a certain time period from the time instant of inserting a fault.

* * * * *